US010840642B2

(12) United States Patent
Kwon et al.

(10) Patent No.: US 10,840,642 B2
(45) Date of Patent: Nov. 17, 2020

(54) CONNECTOR ASSEMBLY AND METHOD OF MANUFACTURING SOCKET FOR CONNECTOR ASSEMBLY

(71) Applicant: Tyco Electronics AMP Korea Co. Ltd, Gyungsangbuk-do (KR)

(72) Inventors: Gi Chan Kwon, Gyungsangbuk-do (KR); Sung Jun Choi, Gyungsangbuk-do (KR); Jun Hyuk Kwon, Gyeonggi-Do (KR); Hoon Jae Kim, Gyeonggi-Do (KR); Jong Jun Lee, Seoul (KR)

(73) Assignee: Tyco Electronics AMP Korea Co. Ltd., Gyungsangbuk-do (KR)

( * ) Notice: Subject to any disclaimer, the term of this patent is extended or adjusted under 35 U.S.C. 154(b) by 34 days.

(21) Appl. No.: 16/224,060

(22) Filed: Dec. 18, 2018

(65) Prior Publication Data

US 2019/0190206 A1 Jun. 20, 2019

(30) Foreign Application Priority Data

Dec. 18, 2017 (KR) ........................ 10-2017-0174544
Apr. 30, 2018 (KR) ........................ 10-2018-0050202

(51) Int. Cl.
*H01R 12/00* (2006.01)
*H05K 1/00* (2006.01)
(Continued)

(52) U.S. Cl.
CPC ......... *H01R 13/6315* (2013.01); *H01R 13/04* (2013.01); *H01R 13/111* (2013.01);
(Continued)

(58) Field of Classification Search
CPC ....... H01R 13/11; H01R 13/111; H01R 13/04; H01R 13/6315; H01R 24/50; H01R 24/64; H01R 43/16
(Continued)

(56) References Cited

U.S. PATENT DOCUMENTS 4,925,403 A 5/1990 Zorzy
6,224,407 B1 5/2001 Duquerroy et al.
(Continued)

FOREIGN PATENT DOCUMENTS

JP 2016-39001 A 3/2016
WO 2011019987 A1 2/2011

OTHER PUBLICATIONS

Partial European Search Report, European Patent Application No. 18212542.7, dated May 8, 2019, 14 pages.
(Continued)

*Primary Examiner* — Hae Moon Hyeon
(74) *Attorney, Agent, or Firm* — Barley Snyder

(57) ABSTRACT

A connector assembly comprises a housing assembly including a housing shell and a center pin disposed on an inner side of the housing shell, and a head assembly including a head shell detachable from the housing shell, a head body fixed to an inner side of the head shell, and a socket mounted on the head body. The socket includes at least four contact members disposed around a central axis of the head body in a circumferential direction. Each of the contact members has a shape bent toward the central axis of the head body.

17 Claims, 11 Drawing Sheets

(51) Int. Cl.

| | |
|---|---|
| ***H01R 13/631*** | (2006.01) |
| ***H01R 13/11*** | (2006.01) |
| ***H01R 13/04*** | (2006.01) |
| ***H01R 43/16*** | (2006.01) |
| *H01R 24/50* | (2011.01) |
| *H01R 12/71* | (2011.01) |

(52) U.S. Cl.
CPC ........... *H01R 43/16* (2013.01); *H01R 12/716* (2013.01); *H01R 24/50* (2013.01)

(58) Field of Classification Search
USPC .................................................... 439/63, 581
See application file for complete search history.

(56) References Cited

U.S. PATENT DOCUMENTS

| | | | | |
|---|---|---|---|---|
| 6,338,634 | B1 * | 1/2002 | Yu | H01R 4/028 439/83 |
| 6,648,653 | B2 * | 11/2003 | Huang | H01R 24/50 439/582 |
| 7,008,235 | B2 * | 3/2006 | Watanabe | H01R 24/50 439/581 |
| 7,118,383 | B2 * | 10/2006 | Nagata | H01R 13/6315 439/63 |
| 7,484,965 | B2 * | 2/2009 | Chien | H01R 24/50 439/63 |
| 8,298,007 | B2 * | 10/2012 | Taguchi | H01R 13/6473 439/578 |
| 9,257,761 | B2 * | 2/2016 | Hirakawa | H01R 13/652 |
| 9,620,900 | B2 * | 4/2017 | Yanase | H01R 24/44 |
| 9,905,968 | B2 | 2/2018 | Yanase et al. | |
| 2004/0038586 | A1 | 2/2004 | Hall et al. | |
| 2012/0214357 | A1 | 8/2012 | Flaherty, IV | |
| 2015/0207242 | A1 * | 7/2015 | Sugiyama | H01R 13/11 439/856 |
| 2015/0207255 | A1 * | 7/2015 | Sugiyama | H01R 13/193 439/852 |
| 2016/0104969 | A1 * | 4/2016 | An | H01R 24/40 439/248 |
| 2019/0165524 | A1 * | 5/2019 | Gra I | H01R 13/631 |

OTHER PUBLICATIONS

English machine translation of JP 2016039001, accessed May 13, 2019, 10 pages.

* cited by examiner

CONNECTOR ASSEMBLY AND METHOD OF MANUFACTURING SOCKET FOR CONNECTOR ASSEMBLY

CROSS-REFERENCE TO RELATED APPLICATIONS

This application claims the benefit of the filing date under 35 U.S.C. § 119(a)-(d) of Korean Patent Application No. 10-2017-0174544, filed on Dec. 18, 2017, and Korean Patent Application No. 10-2018-0050202, filed on Apr. 30, 2018.

FIELD OF THE INVENTION

The present invention relates to a connector assembly and, more particularly, to a connector assembly having a socket.

BACKGROUND

A connector assembly is used for mechanical and electrical connection between constituent elements of various modules. For example, the connector assembly may be used for a camera module, which is a module including various types of lenses and electronic components constituting a camera. Tolerances of the components and assembly errors impede an accurate connection of a head assembly attached to a printed circuit board (PCB) to a housing assembly, such that a performance of the connector assembly decreases or the components are damaged.

SUMMARY

A connector assembly comprises a housing assembly including a housing shell and a center pin disposed on an inner side of the housing shell, and a head assembly including a head shell detachable from the housing shell, a head body fixed to an inner side of the head shell, and a socket mounted on the head body. The socket includes at least four contact members disposed around a central axis of the head body in a circumferential direction. Each of the contact members has a shape bent toward the central axis of the head body.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
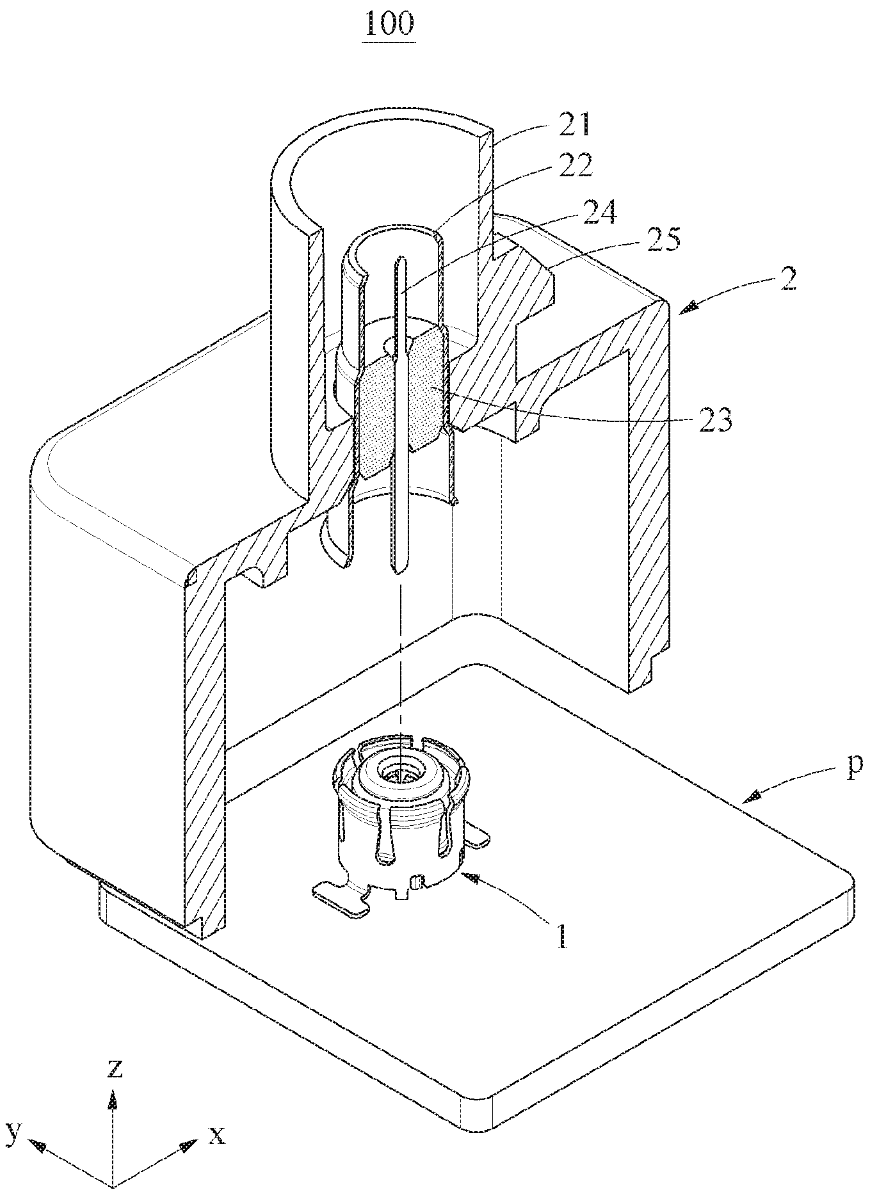
FIG. 1 is a perspective view of a connector assembly in which a housing assembly and a head assembly are separated.

Exemplary embodiments of the invention will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of example embodiments, detailed description of well-known related structures or functions will be omitted when it is deemed that such description will cause ambiguous interpretation of the present disclosure. The present invention may be embodied in many different forms and should not be construed as being limited to the embodiments set forth herein; rather, these embodiments are provided so that the disclosure will fully convey the concept of the invention to those skilled in the art.

Figure 2:
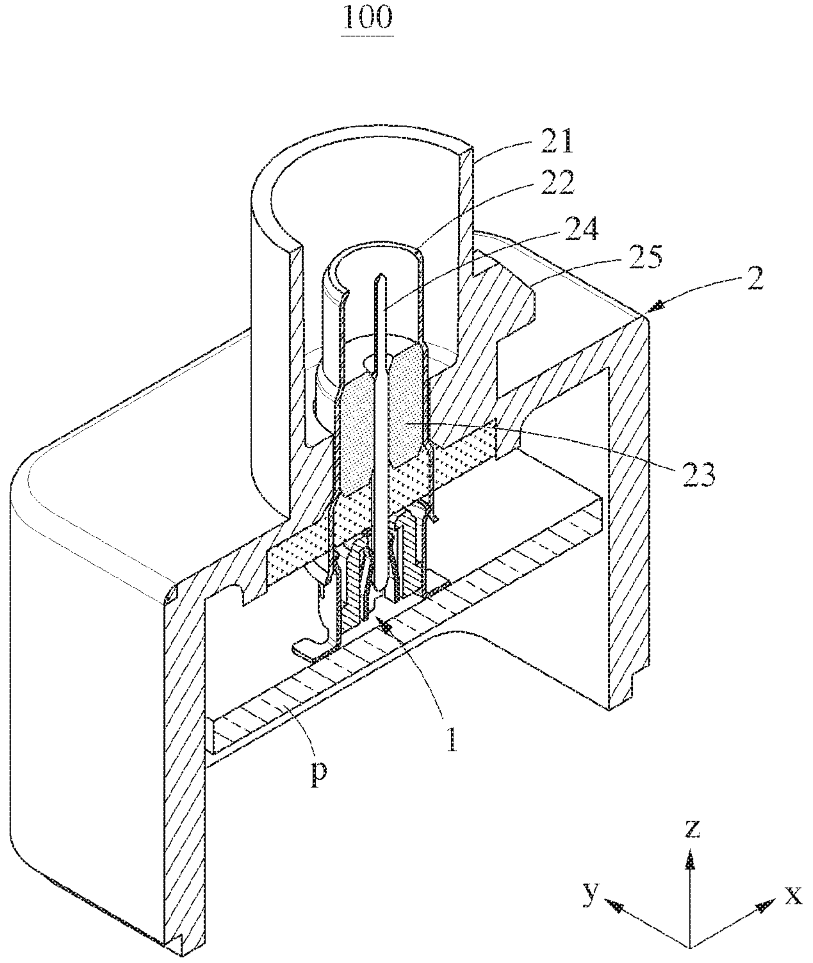
FIG. 2 is a perspective view of the connector assembly with the housing assembly and the head assembly connected.

A connector assembly 100 according to an embodiment, as shown in FIGS. 1 and 2, includes a head assembly 1 and a housing assembly 2 connected in a floating structure. Other elements of the connector assembly 100, for example, an image sensor and the like, are omitted from the drawings for ease of description.

As shown in FIGS. 1 and 2, the head assembly 1 may be mounted on a printed circuit board (PCB) P. In an embodiment, the head assembly 1 is soldered to the PCB P. The head assembly 1 electrically connects the image sensor and the PCB P.

The PCB P, as shown in FIGS. 1 and 2, may have a shape corresponding to an inner space of the housing assembly 2. The PCB P may be inserted into inner walls of the housing assembly 2 and slides along the inner walls of the housing assembly 2. When the PCB P moves upward along the inner walls of the housing assembly 2, the head assembly 1 and the housing assembly 2 are connected. When the PCB P moves downward along the inner walls of the housing assembly 2, the head assembly 1 and the housing assembly 2 are separated. Upward and downward refers to a z-axial direction of coordinate axes shown in FIGS. 1 and 2.

The housing assembly 2, as shown in FIGS. 1 and 2, includes a housing body 21, a housing shell 22, a dielectric 23, a center pin 24, and a coupler 25. The housing body 21 forms an exterior of the housing assembly 2 and has a shape protruding upward. The other elements of the connector assembly 100, for example, the image sensor (not shown), may be easily connected through the protruding shape of the housing body 21. The coupler 25 is disposed on a side portion of the protruding shape of the housing body 21 and prevents separation of the other elements of the connector assembly 100 from the housing body 21. The coupler 25 is a protrusion in the embodiment of FIGS. 1 and 2, however, in other embodiments, the shape of the coupler 25 is not limited thereto. In other embodiments, the coupler 25 may be a groove or a hole.

The housing shell 22, as shown in FIG. 2, contacts a first portion of the head assembly 1. The first portion may be a head shell 11, described in greater detail below. The housing shell 22 is electrically connected to the head assembly 1 and is disposed in an upper portion of the housing body 21. In the shown embodiment, the housing shell 22 is mounted on an inner side of the protruding shape of the housing body 21.

As shown in FIGS. 1 and 2, the dielectric 23 is disposed on an inner side of the housing shell 22 to support the center pin 24. The center pin 24 contacts a second portion of the head assembly 1. The second portion is a socket 13, described in greater detail below. The center pin 24 electrically connects the other elements of the connector assembly 100, for example, the image sensor (not shown), to the PCB P. The center pin 24 is disposed on the inner side of the housing shell 22 and extends parallel to a central axis of the housing shell 22.

The head assembly 1, as shown in FIGS. 3A-6C, includes the head shell 11, a head body 12, and the socket 13.

The head shell 11 is detachable from the housing shell 22. The head shell 11 forms an exterior of the head assembly 1. As shown in FIGS. 3B, 4B, 5B, and 6A, the head shell 11 includes a plurality of branch members 111 disposed around a central axis of the head shell 11 in a circumferential direction, a plurality of support members 112 fixed to the PCB, and a bending member 113 to fix the head body 12. The plurality of branch members 111 are inserted into an inner side of the housing shell 22 and at least one of the plurality of branch members 111 contacts the housing shell 22. The plurality of branch members 111 each have a shape bent outward to easily contact the housing shell 22. The plurality of support members 112 include, for example, two support members 112 disposed on opposite sides about the central axis of the head shell 11.

Figure 6C:
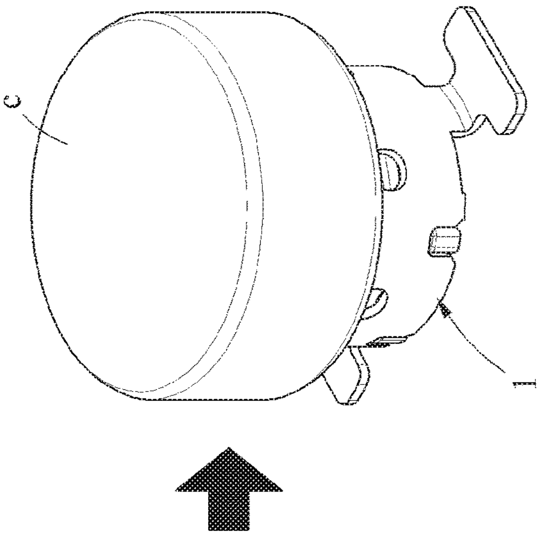
FIG. 6C is a perspective view of the head assembly with a suction cap.
Figure 6B:
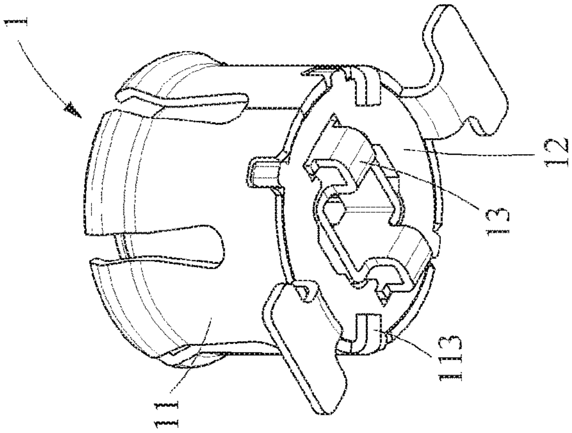
FIG. 6B is a perspective view of the head assembly in an assembled state.
Figure 6A:
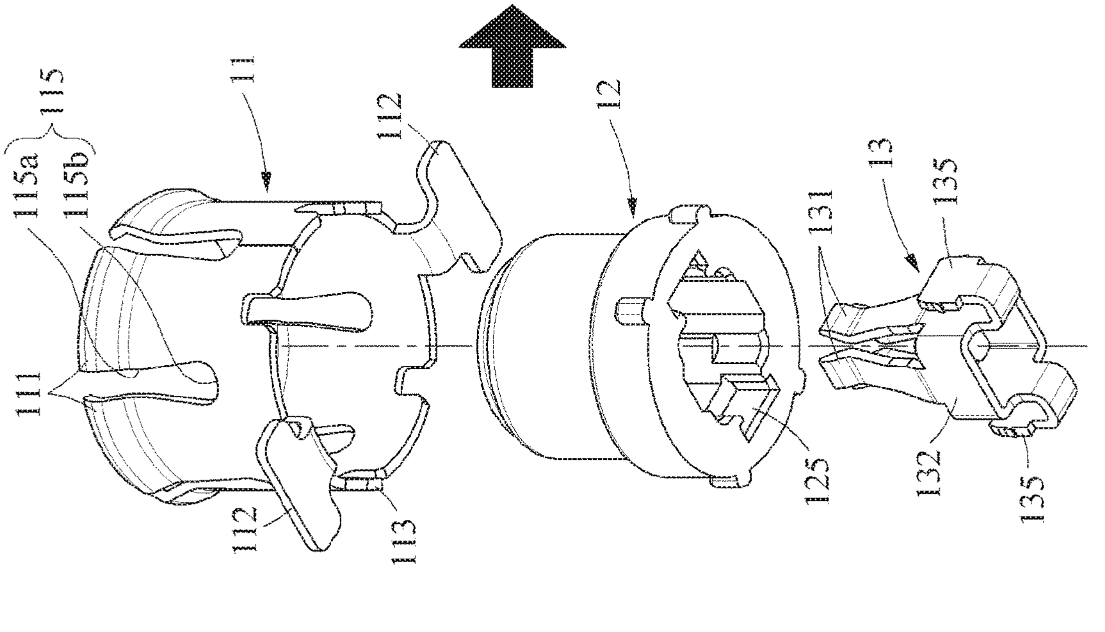
FIG. 6A is an exploded perspective view of the head assembly.

The head shell 11 includes a plurality of branch grooves 115 formed between the plurality of branch members 111, as shown in FIG. 6A. The plurality of branch grooves 115 include a first portion 115*a* with a width which increases downward and a second portion 115*b* provided at a lower end of the first portion 115*a* in a round shape recessed downward. The shape of the branch grooves 115 reduces a plastic deformation of the plurality of branch members 111.

The bending member 113 protrudes downward and, as shown in FIGS. 3B, 4B, 5B, and 6B, may be bent inward after the head body 12 is mounted on the inner side of the head shell 11. The inwardly bent bending member 113 prevents a separation of the head body 12 from the head shell 11.

As shown in FIGS. 3A-6C, the head body 12 is mounted on the inner side of the head shell 11. A central axis a of the head body 12 is identical to the central axis of the head shell 11. The head body 12 supports the socket 13. The head body 12 includes a head side portion 121 to be inserted into inner walls of the head shell 11, a head upper portion 122 formed on an upper side of the head side portion 121, and an insertion groove 125. The head upper portion 122 includes, at a center thereof, a hole through which the center pin 24 is inserted. The insertion groove 125 may be formed on a lower side of the head side portion 121.

The socket 13 is detachable from the head body 12 and, as shown in FIGS. 3A-6C, includes a plurality of contact members 131, a fixture 132, and an insertion member 135.

The fixture 132 has a shape corresponding to the inner walls of the head body 12 and fixed to the inner walls of the head body 12. The plurality of contact members 131 are formed of a conductive material which may be electrically connected to the center pin 24, and each have a shape bent toward the central axis a of the head body 12. The plurality of contact members 131 each include a central portion having a shape bent more inward than an upper portion or a lower portion thereof. The plurality of contact members 131 are elastically deformable; when an external force is applied to the plurality of contact members 131, the plurality of contact members 131 may be deformed around the fixture 132.

Figure 3A:
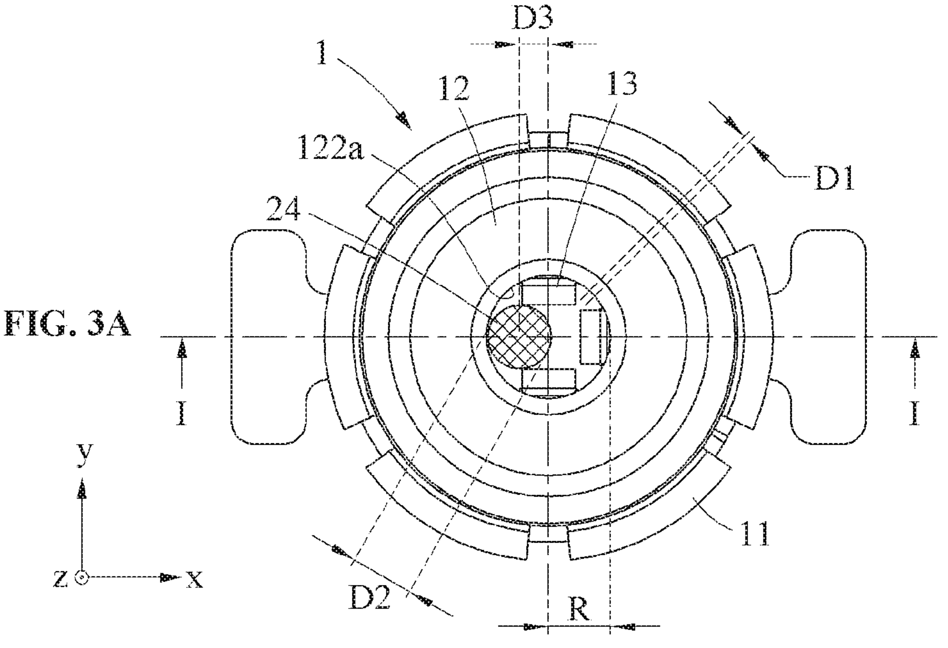
FIG. 3A is a top view of a center pin of the housing assembly connected to the head assembly while biased in an x-axial direction.
Figure 3B:
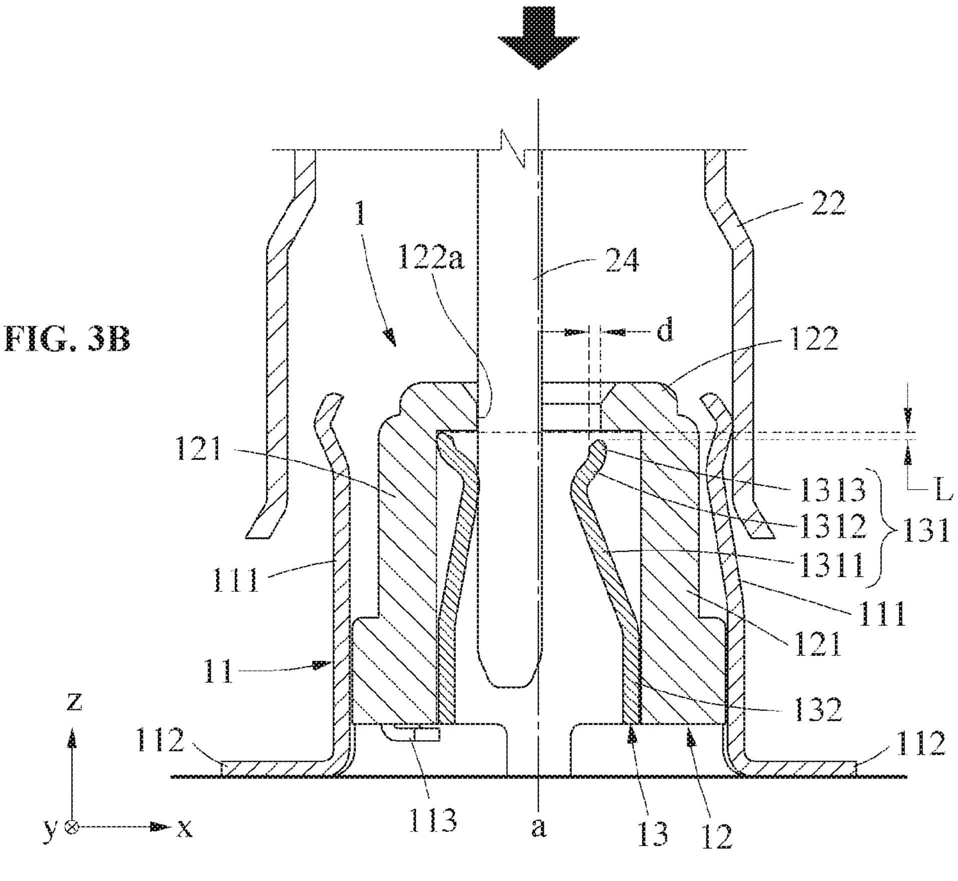
FIG. 3B is a sectional side view taken along line I-I of FIG. 3A.
Figure 4A:
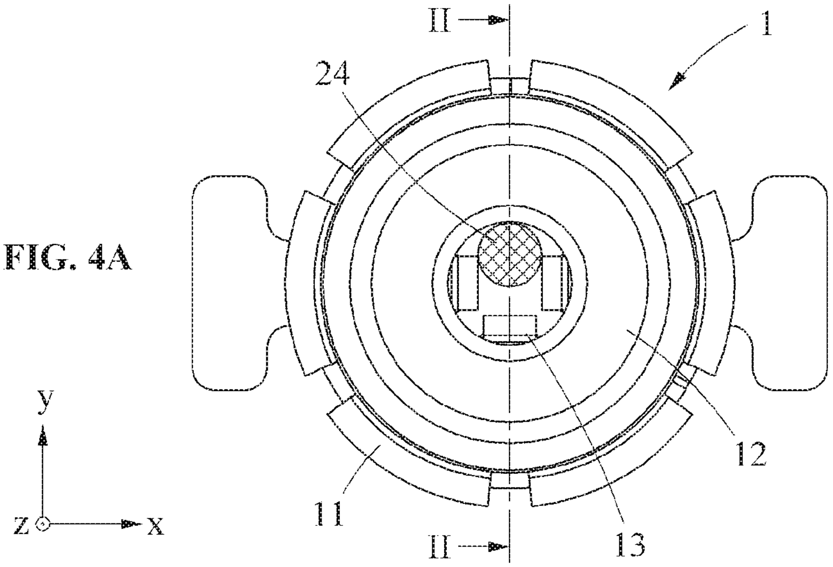
FIG. 4A is a top view of the center pin connected to the head assembly while biased in a y-axial direction.
Figure 4B:
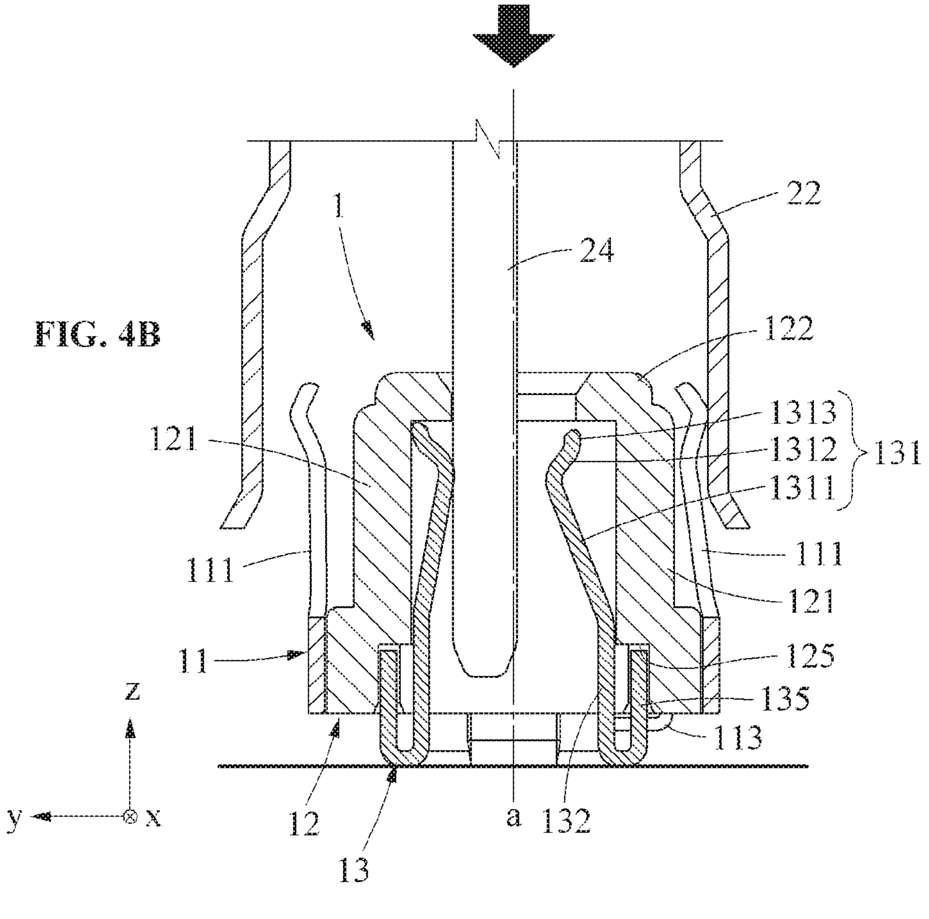
FIG. 4B is a sectional side view taken along line II-II of FIG. 4A.
Figure 5A:
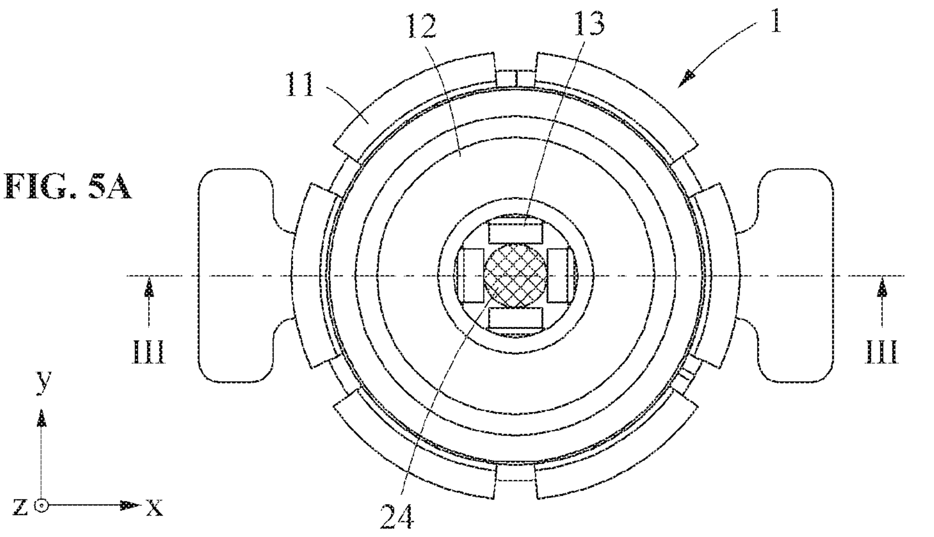
FIG. 5A is a top view of the center pin connected to the head assembly in a non-biased position.
Figure 5B:
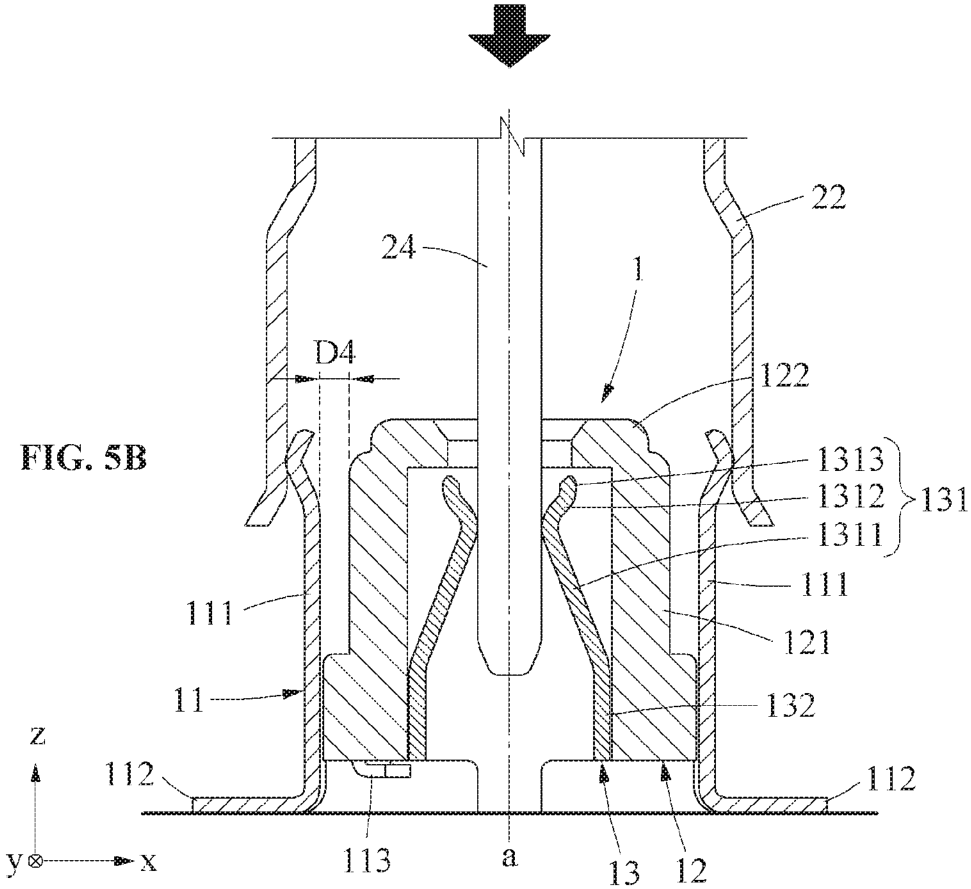
FIG. 5B is a sectional side view taken along line III-III of FIG. 5A.

When the center pin 24 is inserted into the head assembly 1, as shown in FIGS. 3A-5B, the center pin 24 may push the plurality of contact members 131 outward. For example, as shown in FIGS. 3A and 3B, if the center pin 24 is inserted into the head assembly 1 while biased in an x-axial direction, the contact members 131 may be deformed outward around the fixture 132. As shown in FIGS. 4A and 4B, even if the center pin 24 is inserted into the head assembly 1 while biased in a y-axial direction, the contact members 131 may be deformed or deflected outward around the fixture 132. FIGS. 5A and 5B show the center pin 24 properly inserted without being biased in a direction.

The plurality of contact members 131 may be disposed around the central axis a of the head body 12 in a circumferential direction as shown in FIGS. 3A-5B. Although FIGS. 3A-5B show four contact members 131, the number of the plurality of contact members 131 may be greater than or equal to four. The plurality of contact members 131 may be disposed at predetermined intervals.

The plurality of contact members 131 each include a first extension 1311, a second extension 1312, and a third extension 1313, as shown in FIGS. 3B, 4B, and 5B.

The first extension 1311 extends upward from the fixture 132 and is inclined toward the central axis a of the head body 12. A separation distance between the first extension 1311 and the head side portion 121 of the head body 12 increases toward an upper portion of the first extension 1311. The first extension 1311 is a longitudinal member. The first extension 1311 allows the center pin 24 and the contact members 131 to easily contact each other even when the center pin 24 is not inserted along the central axis a of the head body 12.

The second extension 1312 extends upward from the first extension 1311 and is inclined toward the inner walls of the head body 12. A separation distance between the second extension 1312 and the central axis a of the head body 12 increases toward an upper portion of the second extension 1312. The second extension 1312 is a longitudinal member. The second extension 1312 guides the center pin 24 to the central axis a of the head body 12 even when the center pin 24 is not inserted along the central axis a of the head body 12. The second extension 1312 helps the center pin 24 to be inserted into the inner side of the socket 13 and caught by the contact members 131.

A connecting portion of the first extension 1311 and the second extension 1312 is positioned closer to the central axis a of the head body 12 than any other portion of the socket 13 and contacts the center pin 24. Through the connecting portion, the contact members 131 and the center pin 24 are electrically connected. The connecting portion is shown in FIGS. 3A, 4A, and 5A, and the connecting portions may be arranged densely. A distance between connecting portions of adjacent contact members 131 may be less than a width of the center pin 24. Thus, even when the center pin 24 is inserted out of alignment with the central axis a of the head body 12, at least one of the plurality of contact members 131 contacts the center pin 24.

The third extension 1313, as shown in FIGS. 3B, 4B, and 5B, extends upward from the second extension 1312 and is inclined in a direction from the second extension 1312 toward the central axis a of the head body 12. The third extension 1313 is inclined toward the central axis a of the head body 12 with respect to a virtual extension line of the second extension 1312. A separation distance between an upper end of the third extension 1313 and the central axis a of the head body 12 may be greater than or equal to a separation distance between a lower end of the third extension 1313 and the central axis a of the head body 12. For example, the third extension 1313 may become closer to the inner walls of the head body 12 from the lower end toward the upper end thereof. In another embodiment, the third extension 1313 may be parallel to the inner walls of the head body 12.

In an embodiment in which the third extension 1313 is not formed, a sharp end portion of the second extension 1312 may contact inner side walls of the head body 12 and damage the inner walls of the head body 12. However, in an embodiment in which the third extension 1313 is formed as shown in FIGS. 3A-5B, such a concern is prevented. Further, when compared to an embodiment in which the second extension 1312 extends to a height of the third extension 1313, the third extension 1313 increases a range of angles within which the contact members 131 are deformed around the fixture 132. That is, when designing the contact members 131 to have a predetermined range of deformation angle, a width of an inner space of the head body 12 may be reduced. By reducing an overall size of the head body 12 or, conversely, by increasing a thickness of the head body 12, a strength of the head body 12 may improve.

In an embodiment, the third extension 1313 may be positioned closer to the central axis a of the head body 12 than the fixture 132. It is thus possible to design the third extension 1313 not to contact the inner walls of the head body 12 even when the contact members 131 are deformed or deflected outward.

When the contact members 131 do not receive a force from the center pin 24, the upper end of the third extension 1313 is spaced apart from upper inner walls of the head body 12 by a distance L, as shown in FIG. 3B. The third extension 1313 does not interfere with the upper inner walls of the head body 12 while the contact members 131 are deformed outward. When the contact members 131 are deformed or deflected by the center pin 24, the upper end of the third extension 1313 approaches the upper inner walls of the head body 12.

An inner side of the third extension 1313 is closer to the central axis a of the head body 12 than an inner side of the head body 12; the inner side of the head body 12 may refer to an inner side of the head upper portion 122. The inner side of the third extension 1313 may be closer to the central axis a of the head body 12 than the inner side of the head body 12 by a distance d shown in FIG. 3B. The third extension 1313 thereby stably guides the center pin 24 to the inner side of the socket 13.

The insertion member 135, as shown in FIGS. 4B and 6A, is formed on a lower side of the fixture 132. The insertion member 135 extends toward a lower portion of the fixture 132 and is bent perpendicularly two times, thereby having a shape parallel to the fixture 132. The insertion member 135 is inserted into the insertion groove 125, and the socket 13 may thereby be stably mounted on the head body 12.

A suction cap c, as shown in FIG. 6C, may be mounted on the upper portion of the head assembly 1.

FIGS. 3A-4B illustrate states in which the center pin 24 is connected to the socket 13 while offset from the central axis a of the head body 12, and FIGS. 5A and 5B illustrates a state in which the center pin 24 is connected to the socket 13 along the central axis a of the head body 12.

A distance between contact members 131 facing each other may be less than a diameter D2 of the center pin 24. When the center pin 24 is connected to the socket 13 along the central axis a of the head body 12, the center pin 24 may contact all of the at least four contact members 131. Since the center pin 24 maintains the contact with all the at least four contact members 131, electrical connections between the center pin 24 and the contact members 131 may be stably guaranteed. When the center pin 24 is connected to the socket 13 while offset from the central axis a of the head body 12, the center pin 24 may contact at least two of the at least four contact members 131. The at least two contact members 131 may be contact members 131 adjacent to each other. In the example shown in FIGS. 3A and 3B, when the center pin 24 is offset in a direction of −x, the center pin 24 may be spaced apart from the contact members 131 disposed in a direction of +x. Even in this example, the center pin 24 may contact the contact members 131 disposed in the direction of −x, a direction of +y, and a direction of −y.

As the number of contact members 131 in contact with the center pin 24 increases, an electrical connection between the center pin 24 and the socket 13 may be stably implemented. When the center pin 24 is connected to the socket 13 at a regular, non-offset position, the center pin 24 may contact all the at least four contact members 131. When the center pin 24 is offset in an x-axial direction or a y-axial direction, the center pin 24 may contact at least three contact members 131. In addition, when the center pin 24 is offset in both the x-axial direction and the y-axial direction, the center pin 24 may contact at least two contact members 131. A distance D1 between two adjacent contact members 131 among the at least four contact members 131 is less than the diameter D2 of the center pin 24. Thus, even when the center pin 24 is offset between the two adjacent contact members 131, the center pin 24 may be stably connected to the two adjacent contact members 131.

The head body 12, as shown in FIG. 3B, has a circular entrance 122*a* to pass the center pin 24 therethrough. The center pin 24 passes through the entrance 122*a* and is connected to the socket 13. A radius R of the entrance 122*a* is greater than or equal to a sum of a radius of the center pin 24, that is, a half of D2, and a maximum offset length of the center pin 24. An offset length D3 of the center pin 24 shown in FIG. 3A may be determined to be a distance between a central axis of the center pin 24 and the central axis a of the head body 12. The maximum offset length may refer to a maximum distance by which the center pin 24 can be structurally spaced apart from the central axis a of the head body 12 while the head assembly 1 is connected to the housing assembly 2 as shown in FIG. 1. Because the radius R of the entrance 122*a* is greater than or equal to the sum of the radius of the center pin 24, that is, a half of D2, and the maximum offset length of the center pin 24, the center pin 24 may not be caught by the entrance 122*a* even when maximally offset.

When the housing assembly 2 and the head assembly 1 are connected, the head shell 11 is disposed on an inner side of the housing shell 22, as shown in FIGS. 3B, 4B, and 5B. When the center pin 24 is connected to the socket 13 along the central axis a of the head body 12, the distance between the head shell 11 and the head body 12 may be greater than or equal to the maximum offset length of the center pin 24. By the above structure, the head shell 11 may not contact the head body 12 even when the center pin 24 is maximally offset, and thus a possible offset length of the center pin 24 may not be limited.

Figure 7:
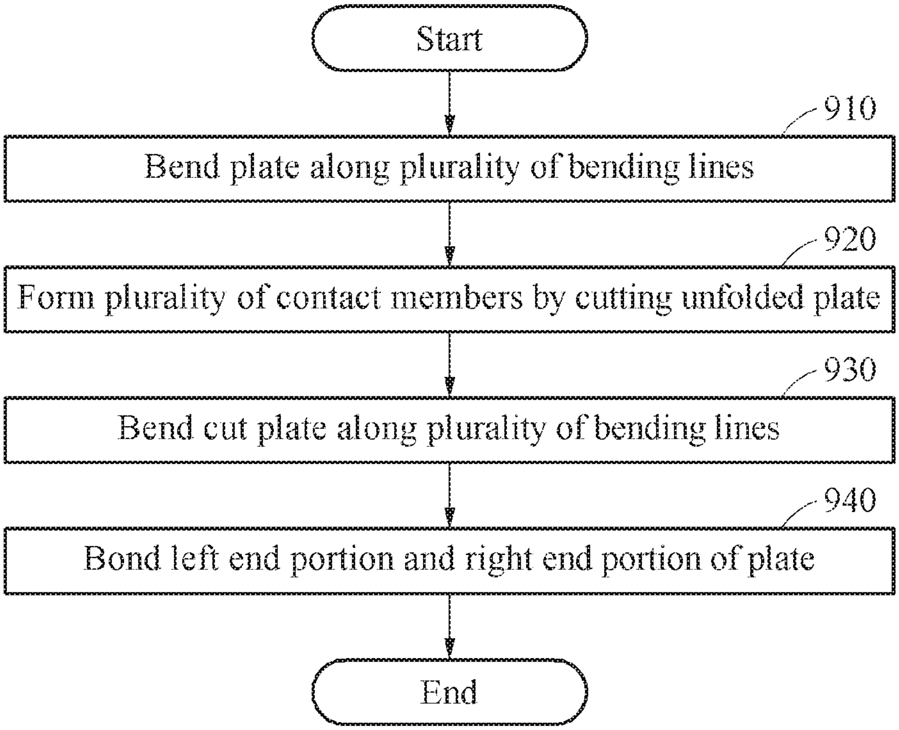
FIG. 7 is a flowchart of a method of manufacturing a socket of head assembly.
Figure 8:
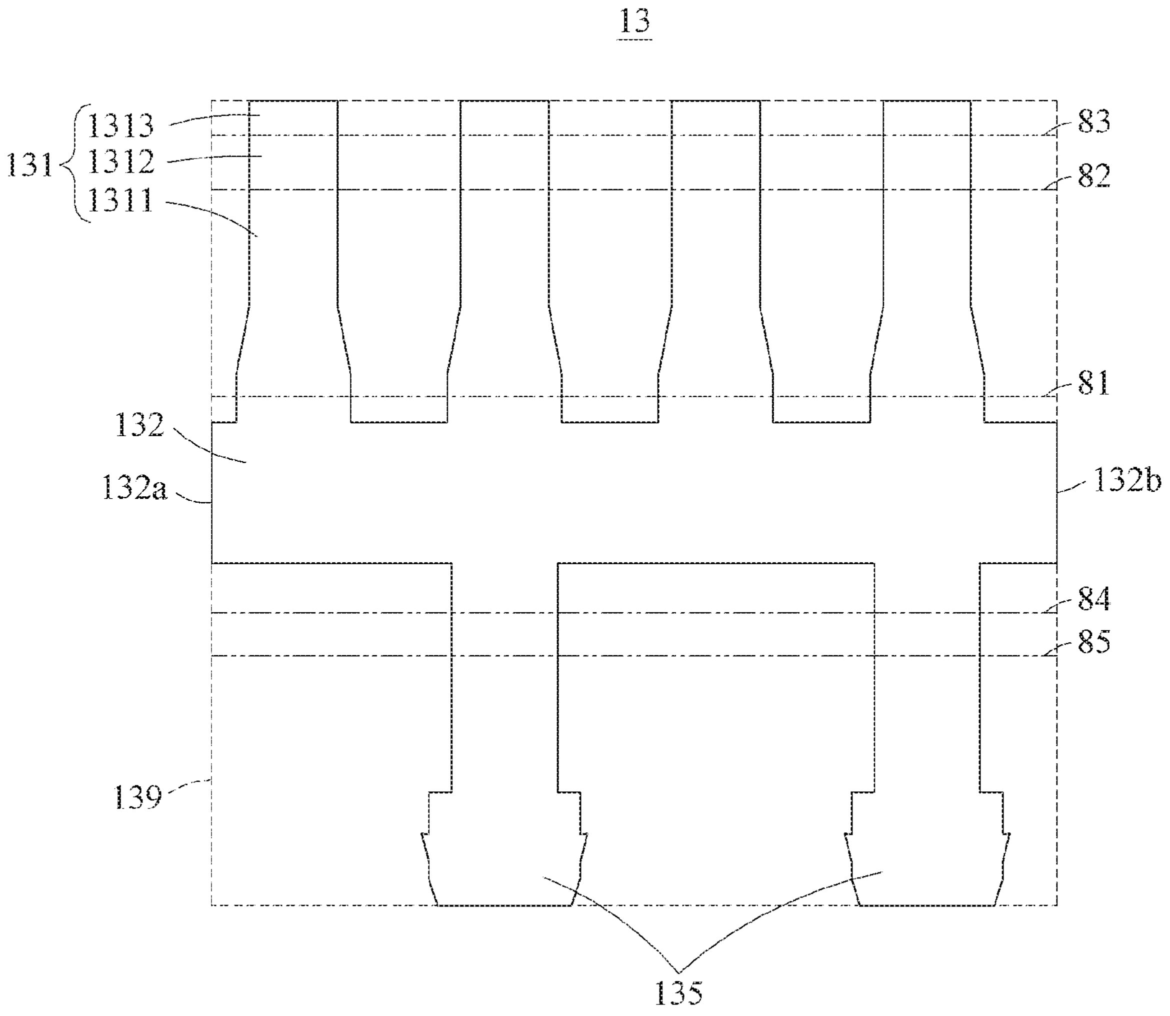
FIG. 8 is a plan view of the socket.

A method of manufacturing the socket 13 for the connector assembly 100, as shown in FIG. 7, includes a step 920 of forming a plurality of contact members 131 by cutting a plate, a step 930 of bending the cut plate along a plurality of bending lines, and a step 940 of bonding a left end portion and a right end portion of the plate. As shown in FIG. 8, a shape of a plate 139 before cutting is indicated with broken lines, and the plurality of bending lines 81-85 is indicated with chain lines.

In step 920, the plate 139 having a planar shape may be cut to form the plurality of contact members 131, the fixture 132, and the insertion member 135, as shown in FIG. 8. Cutting of the plate 139 having the planar shape is easier than cutting a three-dimensional (3D) shape.

In step 930, the cut plate 139 may be bent along the plurality of bending lines 81, 82, 83, 84, and 85. The plurality of bending lines 81, 82, 83, 84, and 85 include first through third bending lines 81, 82, and 83 to form the plurality of contact members 131, and fourth and fifth bending lines 84 and 85 to form the insertion member 135. The plate 139 is bent along the first bending line 81 in a first direction to form the first extension 1311. The plate 139 is bent along the second bending line 82 in a second direction to form the second extension 1312. The second direction is opposite to the first direction. The plate 139 is bent again along the third bending line 83 in the first direction to form the third extension 1313. Through bending the plate 139 three times, the first extension 1311, the second extension 1312, and the third extension 1313 of each of the plurality of contact members 131 may be formed, and the work may be performed quickly. Similarly, the plate 139 may be bent along the fourth bending line 84 and the fifth bending line 85 to form the insertion member 135.

In step 940, the left end portion and the right end portion of the plate 139 may be bonded by rolling the plate 139. For example, a left end portion 132*a* and a right end portion 132*b* of the fixture 132 contact each other.

The method of manufacturing the socket 13 may further include, before the plate 139 is cut, a step 910 of bending the plate 139 along the plurality of bending lines 81, 82, 83, 84, and 85 as shown in FIG. 7. In step 910, the plate 139 having the planar shape is bent along the plurality of bending lines 81, 82, 83, 84, and 85. The plurality of bending lines 81, 82, 83, 84, and 85 include the first through third bending lines 81, 82, and 83 to form the plurality of contact members 131, and the fourth and fifth bending lines 84 and 85 to form the insertion member 135.

In this embodiment, in step 920, the plate 139 being unfolded is cut to form the plurality of contact members 131, the fixture 132, and the insertion member 135. Since a bent plate 139 is not easy to cut, the plate 139 is cut while unfolded for easy work. In step 930, the cut plate 139 is bent along the plurality of bending lines. The cut plate 139 may be bent again along the bending lines along which the plate 139 is already bent in operation 910. Since the plate 139 was already bent one time, the plate 130 may be easily bent with less force. In step 940, the left end portion and the right end portion of the plate 139 are bonded by rolling the plate 139.

As shown in FIG. 8, the first extension 1311 has a shape which gradually narrows upward; this shape prevents an overlap between adjacent contact members 131 even when the plurality of contact members 131 incline upward toward the central axis a of the head body 12.

A head assembly 3 according to another embodiment is shown in FIGS. 9A-11. The head assembly 3 includes a head shell 31, a head body 32, and a socket 33. The head shell 31 includes a plurality of branch members 311, a plurality of support members 312, and a bending member 313. The head body 32 includes a head side portion 321, a head upper portion 322, and an insertion groove 325. The socket 33 includes a plurality of contact members 331, a fixture 332, and an insertion member 335.

Figure 9A:
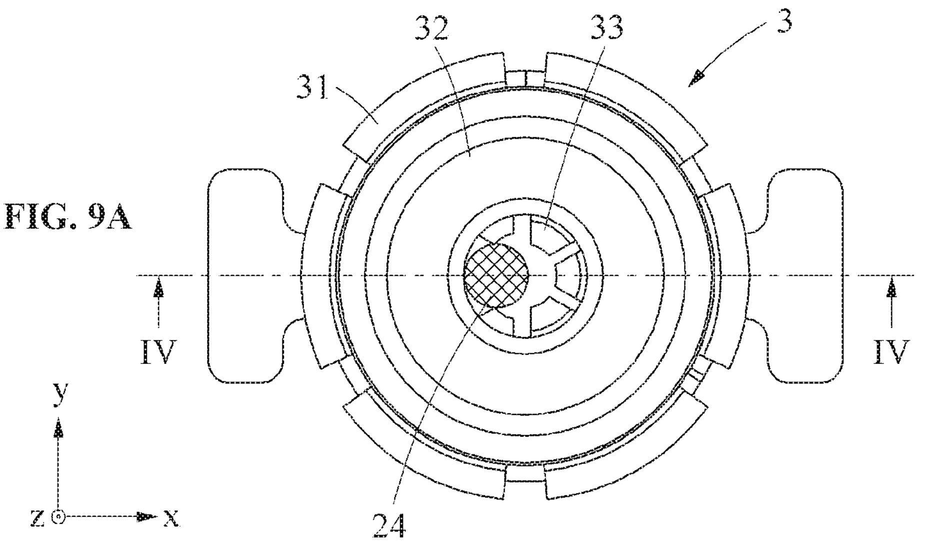
FIG. 9A is a top view of the center pin of the housing assembly connected to a head assembly according to another embodiment while biased in an x-axial direction.
Figure 9B:
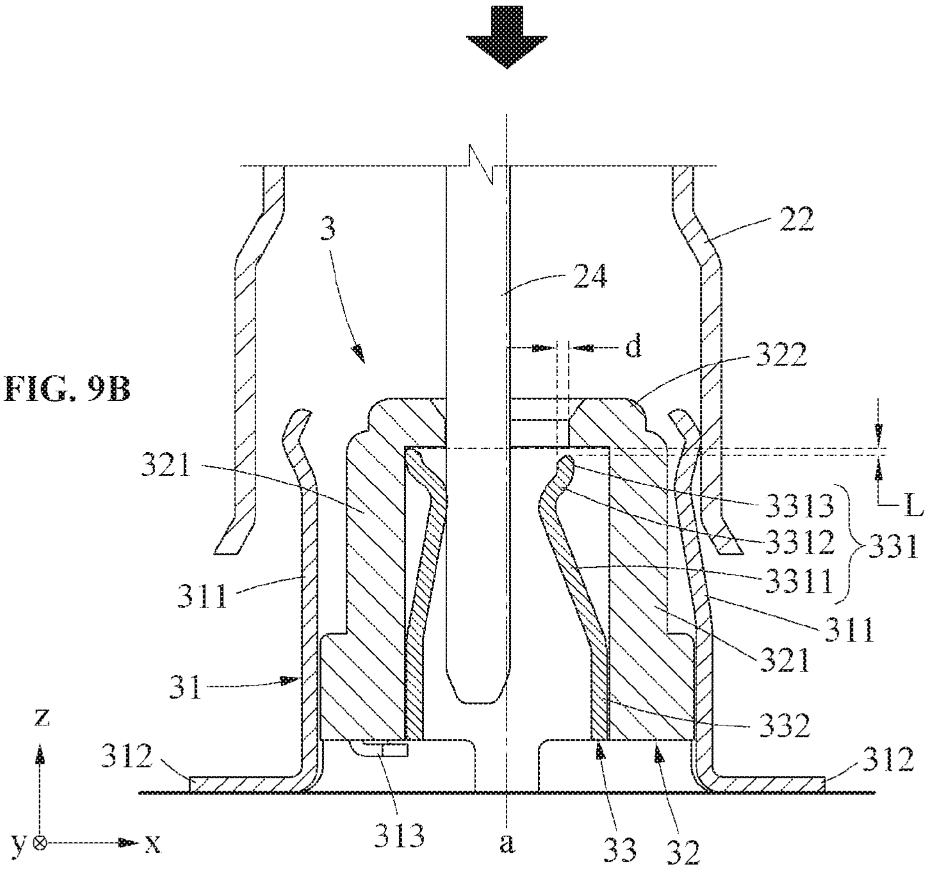
FIG. 9B is a sectional side view taken along line IV-IV of FIG. 9A.
Figure 10A:
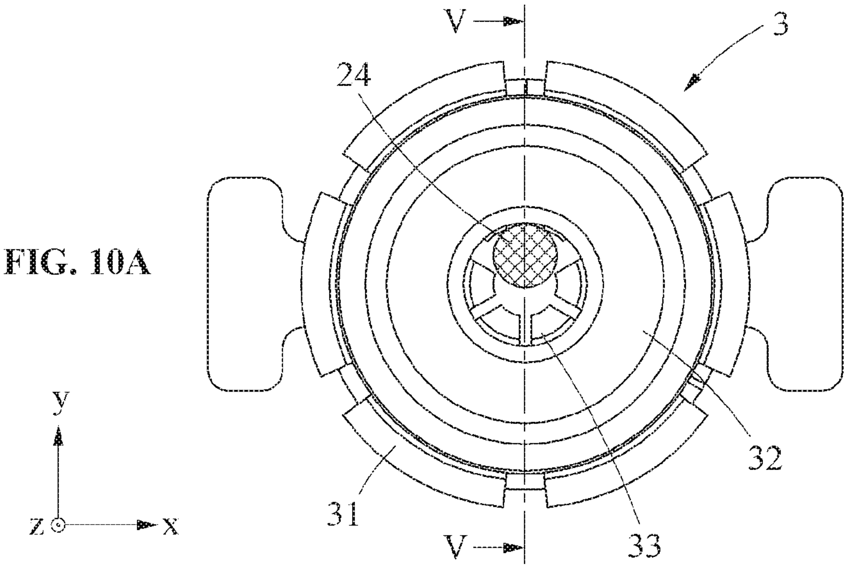
FIG. 10A is a top view of the center pin of the housing assembly connected to the head assembly of FIG. 9A while biased in a y-axial direction.
Figure 10B:
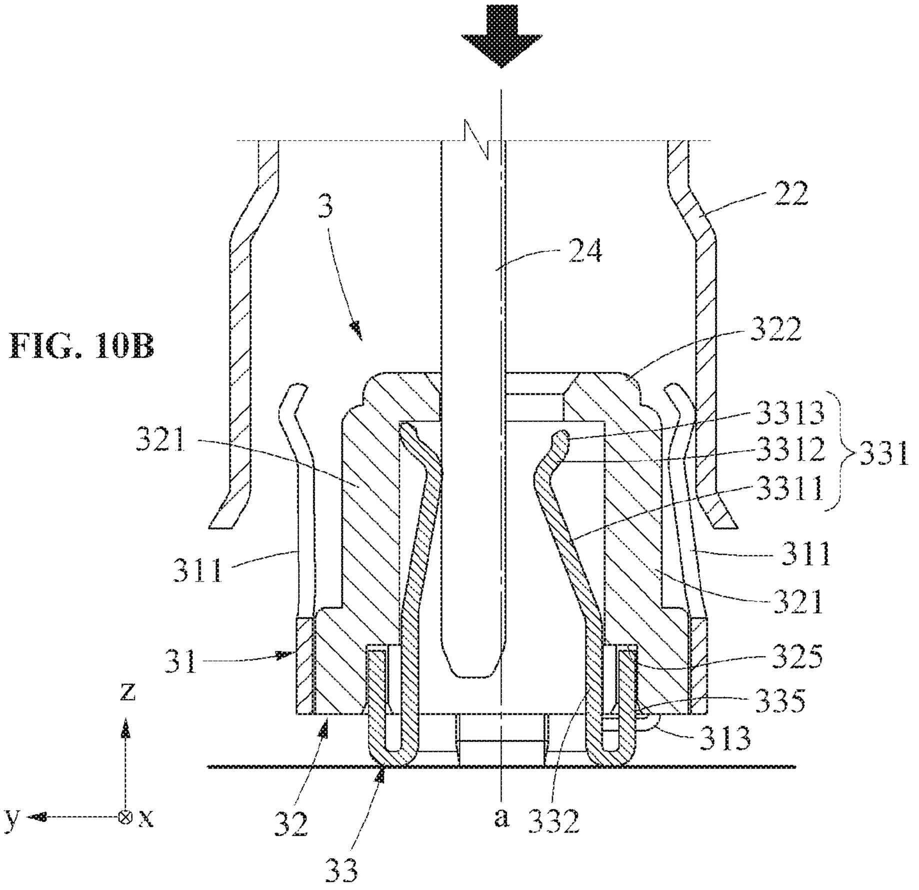
FIG. 10B is a sectional side view taken along line V-V of FIG. 10A.
Figure 11:
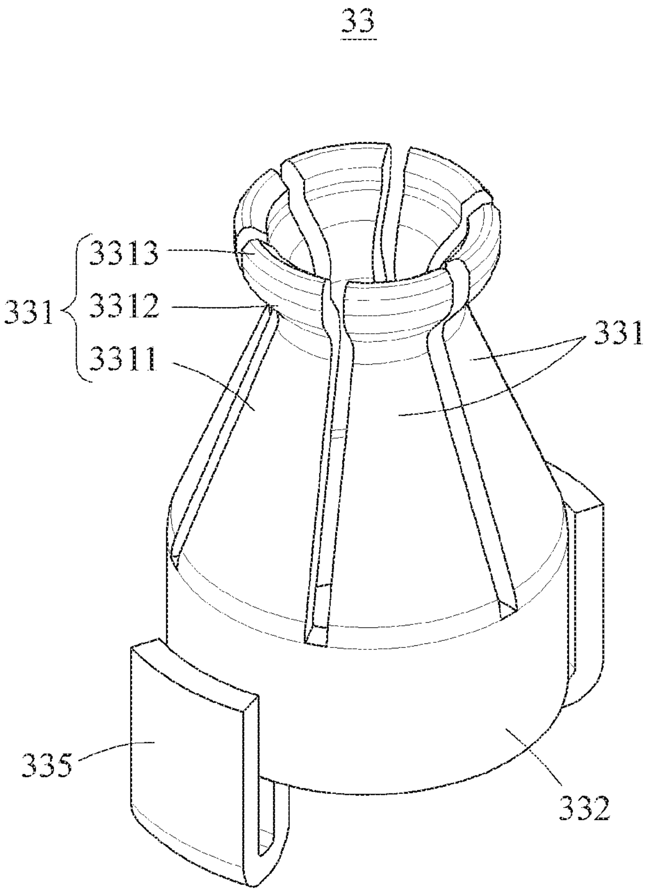
FIG. 11 is a perspective view of a socket of the head assembly of FIG. 9A.

The plurality of contact members 331, as shown in FIGS. 9B and 10B, include a first extension 3311, a second extension 3312, and a third extension 3313. Six contact members 331 may be disposed around a central axis a of the head body 32 in a circumferential direction. The first extension 3311 has a shape which gradually narrows upward, and the second extension 3312 has a shape which gradually broadens upward. The plurality of contact members 331 have a width which decreases as approaching the central axis a of the head body 32. A connecting portion of the first extension 3311 and the second extension 3312 may be a portion with a smallest width among the contact members 331.

Terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected," "coupled," or "joined" to another component, a third component may be "connected," "coupled," and "joined" between the first and second components, although the first component may be directly connected, coupled or joined to the second component.

The same name may be used to describe an element included in the example embodiments described above and an element having a common function. Unless otherwise mentioned, the descriptions on the example embodiments may be applicable to the following example embodiments and thus, duplicated descriptions will be omitted for conciseness.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A connector assembly, comprising:

a housing assembly including a housing shell and a center pin disposed within the housing shell; and a head assembly including a head shell detachable from the housing shell, a head body fixed to an inner side of the head shell, and a socket mounted at least partially within the head body, the socket includes at least four contact members disposed around a central axis of the head body in a circumferential direction, each of the contact members has a shape bent toward the central axis of the head body, wherein the center pin contacts all of the contact members when connected to the socket along the central axis of the head body, and the center pin contacts at least two of the contact members when connected to the socket while offset from the central axis of the head body.

2. The connector assembly of claim 1, wherein a distance between two adjacent contact members among the contact members is less than a diameter of the center pin.

3. The connector assembly of claim 1, wherein the head body includes a circular entrance configured to pass the center pin therethrough, a radius of the circular entrance is greater than or equal to a sum of a radius of the center pin and a maximum offset length of the center pin.

4. The connector assembly of claim 1, wherein the head shell is disposed within the housing shell when the housing assembly and the head assembly are connected to each other.

5. The connector assembly of claim 4, wherein a distance between the head shell and the head body is greater than or equal to a maximum offset length of the center pin when the center pin is connected to the socket along the central axis of the head body.

6. The connector assembly of claim 1, wherein the head shell includes a plurality of branch members disposed around a central axis of the head shell in a circumferential direction.

7. The connector assembly of claim 6, wherein the head shell includes a plurality of branch grooves formed between the plurality of branch members, the plurality of branch grooves each having a first portion with a width which increases downward and a second portion disposed at a lower end of the first portion in a round shape recessed downward.

8. The connector assembly of claim 1, wherein the socket includes a first extension in a shape which gradually narrows upward.

9. The connector assembly of claim 8, wherein each of the contact members has a first extension extending upward from the fixture and inclining toward the central axis of the head body and a second extension extending upward from the first extension and inclining toward the inner wall of the head body.

10. The connector assembly of claim 9, wherein a connecting portion connecting the first extension and the second extension is positioned closer to the central axis of the head body than any other portion of the socket and contacts the center pin.

11. The connector assembly of claim 10, wherein the first extension has a shape which gradually narrows upward.

12. The connector assembly of claim 10, wherein each of the contact members has a third extension extending upward from the second extension and inclining in a direction from the second extension toward the central axis of the head body.

13. The connector assembly of claim 12, wherein the third extension is parallel to the inner wall of the head body.

14. The connector assembly of claim 12, wherein the third extension is positioned closer to the central axis of the head body than the fixture.

15. The connector assembly of claim 14, wherein an inner side of the third extension is positioned closer to the central axis of the head body than an inner side of the head body.

16. The connector assembly of claim 9, wherein an upper end of the second extension is spaced apart from an upper inner wall of the head body when the contact members are not deflected by the center pin.

17. The connector assembly of claim 16, wherein the upper end of the second extension approaches the upper inner wall of the head body when the contact members are deflected by the center pin.

* * * * *